(12) United States Patent
Liu et al.

(10) Patent No.: US 8,306,083 B2
(45) Date of Patent: Nov. 6, 2012

(54) HIGH PERFORMANCE ZNO-BASED LASER DIODES

(75) Inventors: Jianlin Liu, Riverside, CA (US); Sheng Chu, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/570,695

(22) Filed: Sep. 30, 2009

(65) Prior Publication Data

US 2010/0080256 A1    Apr. 1, 2010

Related U.S. Application Data

(60) Provisional application No. 61/101,335, filed on Sep. 30, 2008.

(51) Int. Cl.
*H01S 5/00* (2006.01)
(52) U.S. Cl. .................................................. 372/45.01
(58) Field of Classification Search ............... 372/45.01
See application file for complete search history.

(56) References Cited

U.S. PATENT DOCUMENTS

| | | | |
|---|---|---|---|
| 6,812,483 B2 * | 11/2004 | Ohno et al. ................... | 257/22 |
| 2004/0252737 A1 * | 12/2004 | Yi et al. ........................ | 372/43 |

OTHER PUBLICATIONS

Aoki, T. et al., "p-Type ZnO Layer Formation by Excimer Laser Doping", *Phys. Stat. Sol.*, 2002, vol. (b) 229, Issue No. 2, pp. 911-914.

Bagnall, D. M. et al., "High temperature excitonic stimulated emission from ZnO epitaxial layers", *Applied Physics Letters*, Aug. 24, 1998, vol. 73, Issue 8.

Bagnall, D. M. et al., "Optically pumped lasing of ZnO at room temperature", *Appl. Phys. Lett.*, Apr. 28, 1997, vol. 70, Issue 17.

Bian, J. M. et al., "p-type ZnO films by monodoping of nitrogen and ZnO-based p-n homojunctions", *Applied Physics Letters*, Nov. 1, 2004, vol. 85, Issue 18.

Cao, H. et al., "Ultraviolet lasing in resonators formed by scattering in semiconductor polycrystalline films", *Applied Physics Letters*, Dec. 21, 1998, vol. 73, Issue 25.

Chen, N.B., Sui, C.H., "Recent progress in research on $Mg_xZn_{1-x}O$ alloys", *Materials Science and Engineering B*, 2006, vol. 126, pp. 16-21.

Chen, Z.Q. et al., "Production and recovery of defects in phosphorus-implanted ZnO", "Journal of Applied Physics", 2005, vol. 97, Issue 013528.

(Continued)

*Primary Examiner* — Patrick Stafford
(74) *Attorney, Agent, or Firm* — Knobbe, Martens, Olson & Bear, LLP

(57) ABSTRACT

Systems and methods for electrically pumped, surface-emitting and edge emitting ZnO ultraviolet diode lasers are disclosed. The ZnO diode laser may be fabricated using growth processes (e.g., MBE) to form Sb-doped ZnO as a p-type layer and doped ZnO as an n-type layer. ZnO-based quantum well structures may be further formed in between the n- and p-type ZnO layers. The ZnO layers and quantum wells may be grown in columnar structures which act as resonant cavities for generated light, significantly improving light amplification and providing high power output. For example, ultraviolet lasing at around 380 nm was demonstrated at about room temperature at a threshold current density of about 10 A/cm². The output power was further measured to be about 11.3 μW at about 130 mA driving current.

14 Claims, 13 Drawing Sheets

OTHER PUBLICATIONS

Choopun, S. et al., "Oxygen pressure-tuned epitaxy and optoelectronic properties of laser-deposited ZnO films on sapphire", *Applied Physics Letters*, Dec. 20, 1999, vol. 75, Issue 25.

Huang, Michael H. et al., "Room-Temperature Ultraviolet Nanowire Nanolasers", www.sciencemag.org, 2001, vol. Science 292, Issue 1897.

Hwang, Dae-Kue et al., "Study of the photoluminescence of phosphorus-doped p-type ZnO thin films grown by radio-frequency magnetron sputtering", *Applied Physics Letters*, 2005, vol. 86, Issue 151917.

Jeong, T. S. et al., "Raman scattering and photoluminescence of As ion-implanted ZnO single crystal", *Journal of Applied Physics*, Jul. 1, 2004, vol. 96, Issue 1.

Kamińska, E. et al., "Study of key technological processes to achieve ZnO p-n juntion", *Phys. Stat. Sol. (c)*, 2005, vol. 2, Issue 1119.

Kim, Kyoung-Kook et al., "Realization of p-type ZnO thin films via phosphorus doping and thermal activation of the dopant", *Applied Physics Letters*, Jul. 7, 2003, vol. 83, Issue 1.

Ko, H.J. et al., "Photoluminescence properties of ZnO epilayers grown on $CaF_2(111)$ by plasma assisted molecular beam epitaxy", *Applied Physics Letters*, Apr. 3, 2000, vol. 76, Issue 14.

Li, X. et al., "Chemical vapor deposition-formed p-type ZnO thin films", *J. Vac. Sci. Technol. A.*, Jul. 2, 2003, vol. 21, Issue 4.

Liang, H. W. et al., "P-type ZnO thin films prepared by plasma molecular beam epitaxy using radical NO", *Physica Status Solidi*, 2005, vol. 202, Issue 6, pp. 1060-1065.

Limpijumnong, Sukit et al., "Doping by Large-Size-Mismatched Impurities: The Microscopic Origin of Arsenic or Antimony-Doped p-Type Zinc Oxide", *Physical Review Letters*, Apr. 16, 2004, vol. 92, Issue 15.

Look, D.C. , "Recent advances in ZnO materials and devices", *Materials Science and Engineering B (Elsevier)*, 2001, vol. 80, pp. 383-387.

Look, D.C. et al., "Characterization of homoepitaxial p-type ZnO grown by molecular beam epitaxy", *Applied Physics letters*, Sep. 2, 2002, vol. 81, Issue 10, US.

Look, D.C. et al., "As-doped p-type ZnO produced by an evaporation/sputtering process", *Applied Physics Letters*, Nov. 29, 2004, vol. 85, Issue 22.

Lu, J.G. et al., "p-type conduction in N—Al co-doped ZnO thin films", *Applied Physics Letter*, Oct. 11, 2004, vol. 85, Issue 15, pp. 3134-3135.

Mandalapu, L.J. et al., "p-type behavior from Sb-doped ZnO heterojunction photodiodes", *Applied Physics Letter*, 2006, vol. 88, Issue 112108.

Mandalapu, L.J. et al., "Ultraviolet emission from Sb-doped p-type ZnO based heterojunction light-emitting diodes", *Applied Physics Letters*, 2008, vol. 92, Issue 122101.

Mandalapu, L.J. et al., "Homojunction photodiodes based on Sb-doped p-type ZnO for ultaviolet detection", *Applied Physics Letters*, 2006, vol. 88, Issue 092103.

Ogata, K. et al., "Effects of thermal annealing of ZnO layers grown by MBE", *Journal of Crystal Growth (Elsevier)*, 2000, vol. 214/215, pp. 312-315.

Pearton, S.J. et al., "Recent advances in processing of ZnO", *J. Vac. Sci. Technol.*, May/Jun. 2004, vol. 22, Issue 3, pp. 932-948.

Ryu, Y.R. et al., "Synthesis of p-type ZnO films", *Journal of Crystal Growth (Elsevier)*, 2000, vol. 216, pp. 330-334, US.

Ryu, Y.R. et al., "Excitonic ultraviolet lasing in ZnO-based light emitting devices", *Applied Physics Letters*, 2007, vol. 90, Issue 131115.

Ryu, Y.R. et al., "Properties of arsenic-doped p-type ZnO grown by hybrid beam deposition", *Applied Physics Letters*, Jul. 7, 2003, vol. 83, Issue 1.

Shin, J.W. et al., "Effects of thermal treatment on the formation of the columnar structures in ZnO thin films grown on p-si (100) substrates", *Journal of Applied Physics*, 2006, vol. 100, Issue 013526.

Tang, Z.K. et al., "Self-assembled ZnO nano-crystals and exciton lasing at room temperature", Journal of Crystal Growth (Elsevier), 2006, vol. 287, pp. 169-179.

Tang, Z.K. et al., "Room-temperature ultraviolet laser emission from self-assembled ZnO microcrystallite thin films", *Applied Physics Letters*, Jun. 22, 1998, vol. 72, Issue 25, pp. 3270-3272.

Tsukazaki, Atsushi et al., Repeated temperature modulation epitaxy for p-type doping and light-emitting diode based on ZnO, www.nature.com/naturematerials, *Nature Materials (Nature Publishing Group)*, Jan. 2005, vol. 4, pp. 42-46.

Vaithianathan, Veeramuthu et al., "Preparation of As-doped p-type ZnO films using a $Zn_3As_2$/ZnO target with pulsed laser deposition", *Applied Physics Letters*, 2005, vol. 86, Issue 062101.

Vaithianathan, Veeramuthu et al., "Growth of phosphorus doped ZnO thin films by pulsed laser deposition", Phys. Stat. Sol. (a), Sep. 15, 2004, vol. 201, Issue 12, pp. 2837-2840.

Van De Walle, Chris G. , "Hydrogen as a Cause of Doping in Zinc Oxide", *Physical Review Letters*, Jul. 31, 2000, vol. 85, Issue 5, pp. 1012-1015.

Van Vugt, Lambert K. et al., "Phase-Correlated Nondirectional Laser Emission from the End Facets of a ZnO Nanowire", *Nano Letters* (http://pubs.acs.org), 2006, vol. 6, Issue 12, pp. 2707-2711.

Wang, D. et al., "Lasing in whispering gallery mode in ZnO nanonails", *Journal of Applied Physics*, May 15, 2006, vol. 99, Issue 093112.

Wong, Eva M.; Searson, Peter C., "ZnO quantum particle thin films fabricated by electrophoretic deposition", *Applied Physics Letters*, May 17, 1999, vol. 74, Issue 20.

Xiu, F.X. et al., "Photoluminescence study of Sb-doped p-type ZnO films by molecular-beam epitaxy", *Applied Physics Letters*, Dec. 12, 2005, vol. 87, Issue 252102.

Xiu, F.X. et al., "High-mobility Sb-doped p-type ZnO by molecular-beam epitaxy", *Applied Physics Letters*, 2005, vol. 87, Issue 152101.

Yu, S.F. et al., "Random laser action in ZnO nanorod arrays embedded in ZnO epilayers", *Applied Physics Letters*, Apr. 26, 2004, vol. 84, Issue 17.

Zhang, S.B.; Wei, S.H.; Zunger, Alex, "Intrinsic n-type versus p-type doping asymmetry and the defect physics of ZnO", *Physical Review B*, Jan. 31, 2001, vol. 63, Issue 075205.

\* cited by examiner

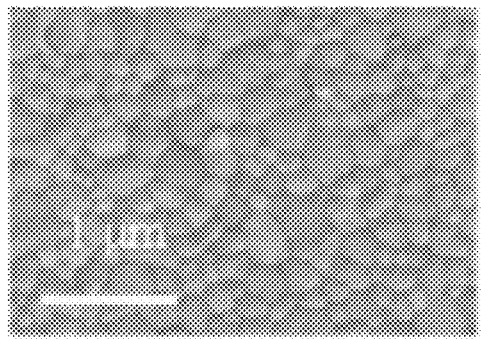 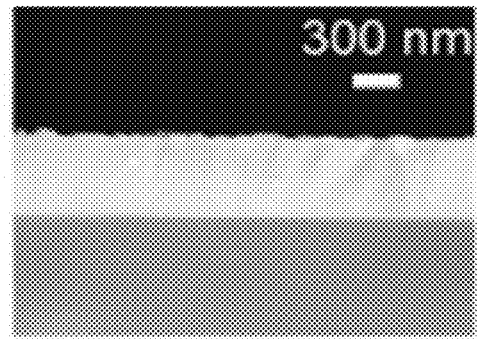
FIG. 4C          FIG. 4D
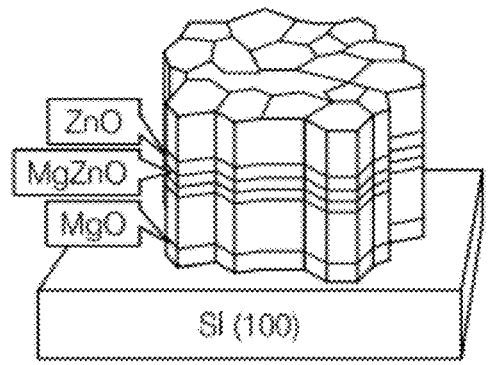
FIG. 4E

HIGH PERFORMANCE ZNO-BASED LASER DIODES

CROSS REFERENCE TO RELATED APPLICATIONS

This application claims the benefit of priority under 35 U.S.C. §119(e) to U.S. Provisional Application No. 61/101,335, filed on Sep. 30, 2008, entitled, "HIGH PERFORMANCE ZnO-BASED LEDS AND LASER DIODES," the entirety of which is incorporated herein by reference.

STATEMENT REGARDING FEDERALLY SPONSORED R&D

This invention was made with Government support under Grant No. ARO-YIP W911NF-08-1-0432 awarded by the Department of Defense and by the Office of Naval Research/Defense Microelectronics Agency (ONR/DMEA) through the Center for NanoScience and Innovation for Defense (CNID) under award number H94003-07-02-0703. The Government has certain rights in this invention

BACKGROUND

1. Field of the Invention

Embodiments of the present disclosure relate to semiconductor devices and, in particular, to zinc oxide-based light emitting diodes (LEDs) and laser diodes.

2. Description of the Related Art

Interest in the development of ultraviolet semiconductor lasers for applications in photonics, information processing, and biology has increased tremendously. Zinc oxide (ZnO) has received considerable attention as a promising material for optoelectronic devices such as blue light emitting and short-wavelength laser diodes with low thresholds in the ultraviolet (UV) region. ZnO is a wide/direct band gap semiconductor, with a band gap of approximately 3.37 eV, and a large exciton binding energy of about 60 meV. These characteristics make ZnO suitable for room-temperature, exciton-enhanced lasing actions, and ZnO lasing has been achieved by optically pumping disordered particles (random lasers), nanowires (nanowire lasers), hexagonal nanonails (whispering gallery mode lasers), and thin films. Unfortunately, optically pumped lasers require even shorter wave-length lasers as pumping sources, resulting in limited potential toward application.

Electrically pumped ultraviolet ZnO semiconductor diode lasers are more suitable for practical applications but few articles have been published about ZnO lasers in the literature. Rather, the literature on green/blue lasers reports on gallium nitride (GaN)-based laser diodes with edge emitting geometries, where the laser light propagates parallel to the wafer surface of the semiconductor.

Such scarcity, even after about a decade of worldwide intensive research efforts an ZnO thin films and nanostructures, may be attributed, at least in part, to a lack of reliable and controllable p-type ZnO. The fabrication of p-type ZnO is relatively difficult due to the self-compensating effect from native defects ($V_o$ and $Zn_i$) and/or Hydrogen (H) incorporation. Moreover, the low solubility and the deep acceptor levels of the dopants may yield low carrier concentrations, making p-type ZnO even harder to fabricate.

SUMMARY

In an embodiment, a ZnO diode laser is provided. The ZnO diode laser comprises a substrate, an n-type ZnO layer, an antimony (Sb)-doped p-type ZnO layer, and a ZnO-based quantum well structure interposed between the n-type ZnO layer and the Sb-doped p-type ZnO layer.

In another embodiment, a ZnO diode laser is provided. The laser diode comprises a substrate comprising at least one of glass, sapphire, and silicon. The laser diode further comprises an n-type ZnO layer. The laser diode additionally comprises a Sb-doped p-type ZnO layer. The laser diode also comprises a ZnO-based quantum well structure interposed between the n-type ZnO layer and the Sb-doped p-type ZnO layer. The n-type ZnO layer, the Sb-doped p-type ZnO layer, and the ZnO-based quantum well structure each possess a columnar configuration.

In a further embodiment, a method of making a ZnO diode laser is provided. The method comprises forming an n-type ZnO layer upon a substrate, forming a Sb-doped p-type ZnO layer, and forming a ZnO-based quantum well structure interposed between the n-type ZnO layer and the Sb-doped p-type ZnO layer.

In an additional embodiment, a method of making a ZnO diode laser is provided. The method comprises providing a substrate comprising at least one of glass, sapphire, and silicon. The method further comprises forming an n-type ZnO layer upon the substrate. The method also comprises forming at least one buffer layer upon the substrate. The method additionally comprises forming a Sb-doped p-type ZnO layer. The method also comprises forming a ZnO-based quantum well structure interposed between the n-type ZnO layer and the Sb-doped p-type ZnO layer. The n-type ZnO layer, the Sb-doped p-type ZnO layer, and the ZnO-based quantum well structure may be formed by growth at a temperature ranging between about 400-650° C. and exhibit a columnar configuration.

BRIEF DESCRIPTION OF THE DRAWINGS

FIG. 4C is an SEM image of a top surface of an embodiment of the ZnO film on a silicon (Si) substrate;

FIG. 4D is an SEM image of a cross-section of an embodiment of a ZnO film on a Si substrate;

FIG. 4E is a schematic of the columnar configuration of the ZnO diode on a Si substrate;

DETAILED DESCRIPTION

Figure 1A:
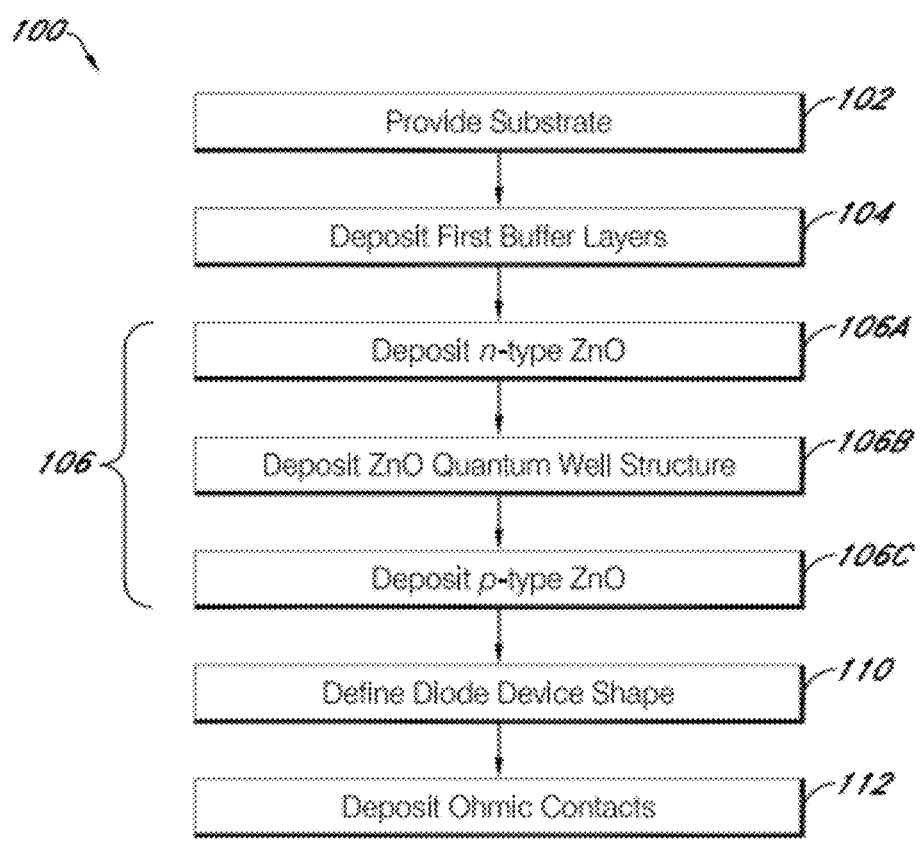
FIG. 1A is a diagram illustrating one embodiment of a process for the fabrication of a columnar zinc oxide (ZnO) laser diode.

Embodiments of the present disclosure present electrically pumped, ZnO ultraviolet diode lasers and LEDs and methods of manufacture. These devices may be formed on a substrate, such as silicon, sapphire, and glass, and operate at about room temperature. In certain embodiments, these devices may further employ a newly developed antimony (Sb)-doped p-type ZnO. Applications of embodiments of the disclosed ZnO LEDs and ZnO laser diodes may include, but are not limited to, solid-state lighting, photonics, information processing, and biology.

In further embodiments, highly efficient methods of achieving reliable Sb-doped p-type ZnO are disclosed. These methods may include, but are not limited to, growth processes such as molecular beam epitaxy (MBE), chemical vapor deposition (CVD), and pulsed laser deposition (PLD). Beneficially, by growing ZnO with Sb dopants, for example, under oxygen rich conditions, p-type ZnO with a high carrier concentration and that is very stable may be generated. The Sb-doped p-type ZnO may be employed for the fabrication of ultraviolet optoelectronic devices such as photodetectors, as well as embodiments of the ZnO diode lasers and LEDs.

While other attempts to fabricate p-type ZnO have been reported, these attempts have encountered problems. For example, some groups have reported successful fabrication of p-type ZnO:N, in which nitrogen (N) substitutes for oxygen (O). However, reliably obtaining p-type ZnO:N remains problematic because nitrogen solubility is low and, thus, obtaining a high carrier concentration is difficult. Furthermore, nitrogen tends to combine with itself to form $N_2$, which does not provide holes.

Other groups have tried obtaining p-type ZnO employing other group-V dopants, including phosphorous (P), arsenic (As), and antimony (Sb), which have much larger ionic radii than O. Limpijumnong et al. (S. Limpijumnong, S. B. Zhang, S. H. Wei, and C. H. Park, Phys. Rev. Lett. 92 15, 2004) proposed a new doping mechanism for As- and Sb-impurities in ZnO based on a first-principles calculation, suggested that As (Sb) would substitute for Zn instead of oxygen and produce two corresponding Zn vacancies, which is a $As_{Zn-2}$ ($Sb_{Zn-2}V_{Zn}$) complex. However, few Sb-doped ZnO studies have been reported in the literature.

For example, Aoki et al. (T. Aoki, Y. Shimizu, A. Miyake, A. Nakamura, Y. Nakanishi, and Y. Hatanaka, Phys. Stat. Sol. (b) 229, 911 2002) have fabricated a Sb-doped ZnO film using an excimer laser doping technique. In their experiment, a layer of Sb was deposited on the intrinsic ZnO film. Then an excimer laser was used to drive Sb impurities into the ZnO film. A p-type Sb-doped ZnO film was allegedly obtained with a carrier concentration of about $5 \times 10^{20}$ cm$^{-3}$, a mobility of about 1.5 cm$^2$/Vs, and a resistivity of about $8 \times 10^{-3}$ Ω-cm, however this reported carrier concentration appears overly high. Furthermore, despite this success, the residual Sb metal film on top of the ZnO layer is difficult to remove and the Sb-doping is non-uniform, each of which may present problems for device performance.

In contrast, the growth methods discussed herein for the formation of p-type ZnO do not suffer from these deficiencies. Rather, these growth techniques result in the formation of structures, including Sb-doped p-type ZnO, which possess a closely packed columnar morphology. This columnar morphology provides a resonant cavity for generated light and significant light amplification, resulting in high power output.

For example, measurements of output power of embodiments of ZnO laser diodes having columnar structures comprising Sb-doped p-type ZnO indicate that exciton lasing is achieved. Furthermore, output powers ranging from about 0.5 µW at about 60 mA driving current to about 11.3 µW at about 130 mA driving current are observed in these systems, the first time for ZnO lasers.

In order to realize this lasing, two conditions were achieved, as discussed in greater detail below. One was population inversion in a gain media, and the other was a resonant cavity in which light may reflect so as to travel a distance (cavity length) equal to an integer multiple of its wavelength.

As discussed below, embodiments of ZnO laser diodes discussed herein comprise ZnO quantum wells interposed between n- and p-type ZnO (p-n junction) in order to achieve population inversion. An exciton mechanism is discussed as a possible mechanism for population inversion. At equilibrium, since the thin quantum well is embedded in the junction position, it does not confine any charged particles such as electrons and holes as they can be easily swept to the n- and p-ZnO regions, respectively by the built-in electrical field. Nevertheless, the thin quantum well can localize excitons, which are neutral. The high exciton binding energy at room temperature, about 60 meV, allows the pile-up of high-density excitons in the quantum well without substantial de-association. Under the forward current injection conditions, the arriving electrons and holes may collide with these excitons and de-associate them through Columbic interactions to form localized population inversion to establish lasing.

In embodiments of ZnO laser diodes disclosed herein, cavities are formed randomly in the film plane, rather than along the growth direction. Light may scatter multiple times at the side walls of the ZnO columns (e.g., grain boundaries) to form closed light loops. For example, the UV light generated by the diode may undergo scattering at the grain boundaries. When the scattering is strong enough, some of the light may be scattered to its origin. As a result, closed-loop resonant cavities for coherent lasing may be formed.

Figure 3A:
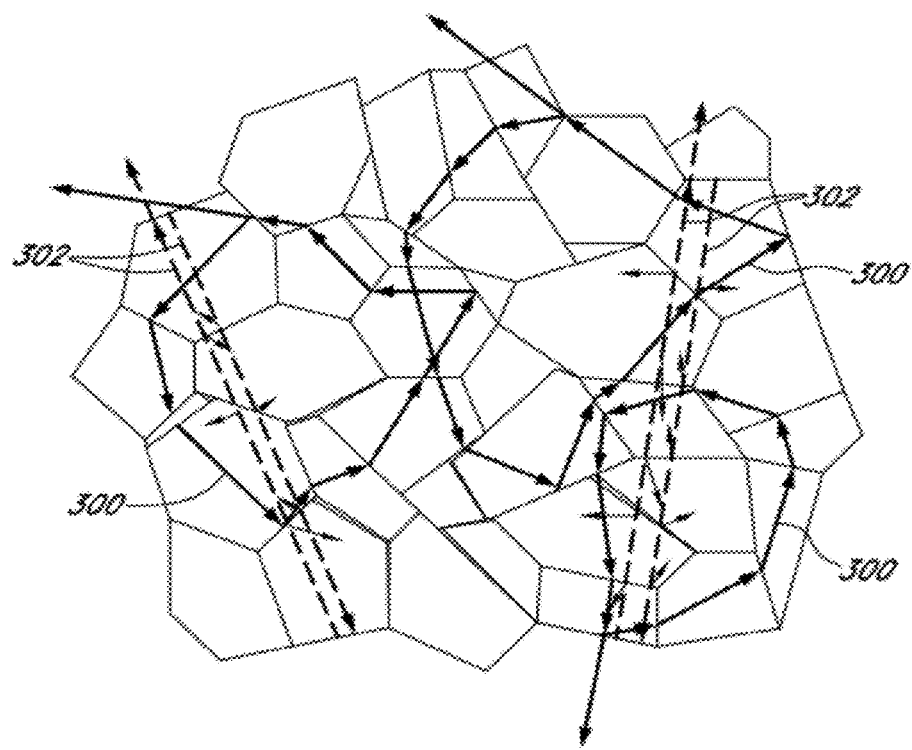
FIG. 3A is a schematic illustration of light scattering in a columnar cavity of an embodiment of the present disclosure; solid lines — light that reflects in closed loops of arbitrary shape which return to their origin point; dashed lines — light that reflects between two parallel side walls from two different columns.

It may be noted that these loops may be either of arbitrary shape 300 (solid lines) or reflected between two parallel side walls from two different columns 302 (dashed lines), as illustrated in FIG. 3A. The two parallel side walls may be very far apart, possibly leading to small threshold current. FIG. 3A illustrates the two possible cavities.

No matter what loops are formed, as long as the light path distance in the closed loop is equal to an integer multiple of the light wavelength, the light can be amplified to form a resonant cavity because at least a portion of the light returns to its origin point, where it may constructively interfere with additional light being generated. When the generation rate of light overcomes the loss (the lasing), lasing oscillation behavior may dominate over the EL spectra. Light incident upon the side walls may be reflected/refracted and the refracted light which escapes the cavity observed as lasing emissions. Because columns have different irregular grain sizes, the scattering/reflection is completely random. This is consistent with observations from the lasing spectrum with multiple lasing mode and unstable lasing peaks from one measurement to another time.

Figure 3B:
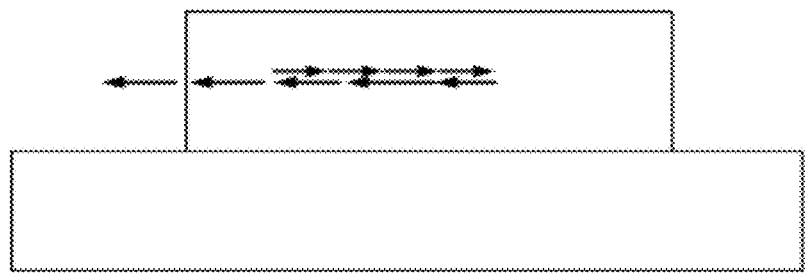
FIGS. 3B-3C are schematic illustrations of embodiments of an edge emitting laser diode (3B) and a surface emitting laser diode (3C)

With the formation of resonant cavities in the film plane, rather than in the growth direction, lasing emissions may be observed from the edge of the diode (edge-emission), provided the side walls of the mesa of the ZnO laser diode are substantially perpendicular to the surface of the substrate. Shaping processes including, but not limited to, chemical etching, polishing, and cleaving may be employed to achieve such an edge configuration. FIG. 3B illustrates how light from a random cavity, incident upon one or more substantially perpendicular edge planes of the mesa, may be reflected/refracted by these planes and observed as emission from the about the diode edges. In certain embodiments, the substantially perpendicular edge planes (i.e., mesa side walls) are positioned at an angle of about 0° with respect to the normal to the substrate surface.

Figure 3C:
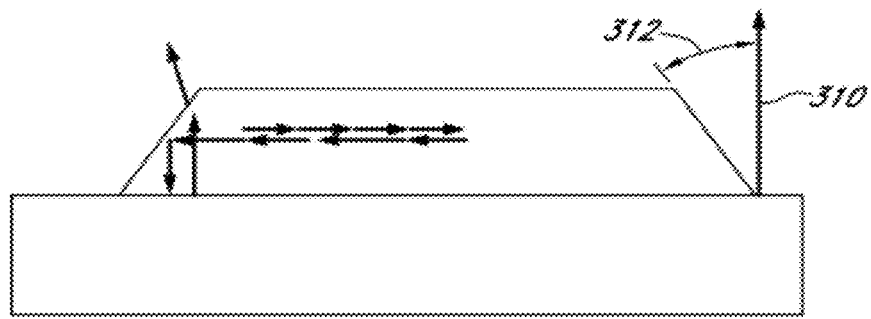

To obtain surface emission from the ZnO laser diode, the edge configuration of the laser diode may be changed, using shaping processes such as those described above. For example, tilted side walls of the etched mesa may be employed (FIG. 3C). In certain embodiments, the tilted sidewalls of the mesa may possess an angle 312 ranging between about 1 to 89° with respect to the normal to the substrate surface. For example, the angle 312 may range between about 1 to 10°, 11 to 20°, 21 to 30°, 31 to 40°, 41 to 50°, 51 to 60°, 61 to 70°, 71 to 80°, and 81 to 89°. In this case, it may be observed that light from a random cavity, incident upon the tilted edge plane (i.e., side walls) of the mesa, may be reflected/refracted by this plane and observed as emission from about the diode surface.

Figure 2:
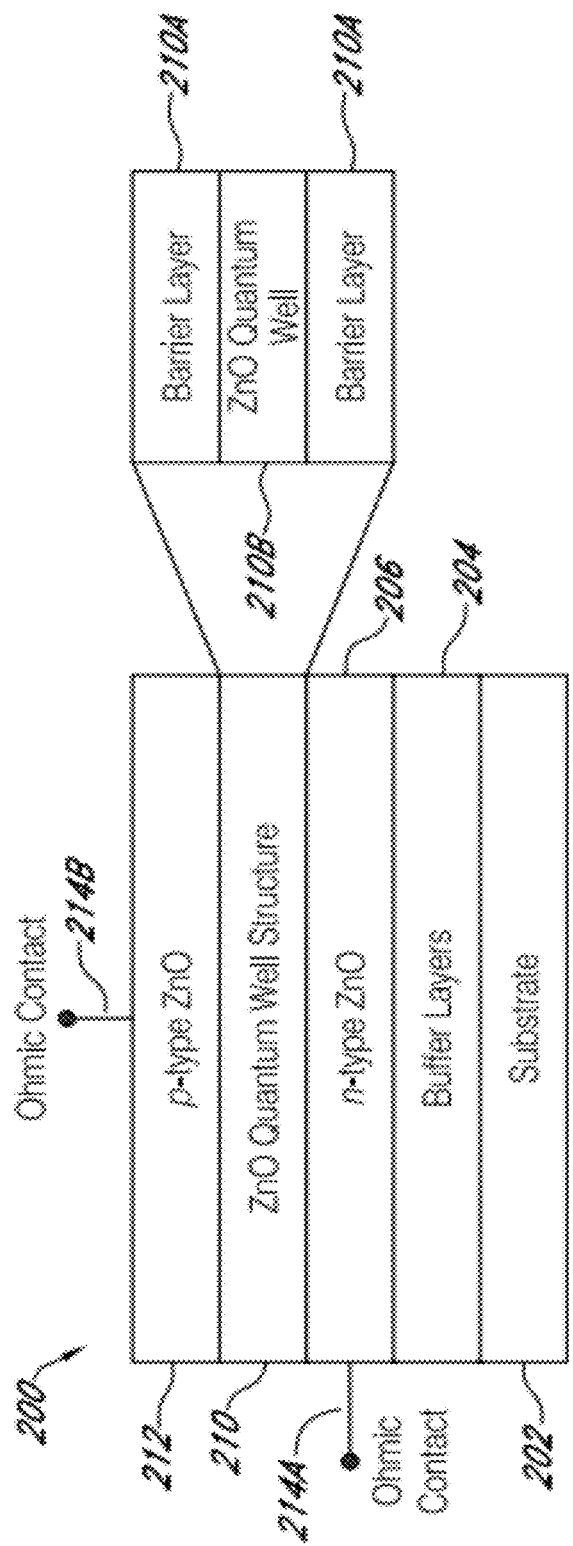
FIG. 2 is a schematic illustration of an embodiment of a ZnO laser diode.

FIG. 1A illustrates one embodiment of a method 100 for the fabrication of a columnar ZnO junction laser of the present disclosure, comprising Sb-doped p-type ZnO. FIG. 2 is one embodiment of the ZnO junction laser 200 formed according to method 100. It may be understood that the processes disclosed herein may include greater or fewer steps and may be performed in any desired order, without limit.

In certain embodiments, the ZnO junction laser may be grown in a plurality of layers using Molecular Beam Epitaxy (MBE). However, in other embodiments, growth processes such as CVD and PLD may be employed. Selecting both a substrate and growth conditions which form epitaxial layers in a columnar configuration assist in providing lasing in the ZnO junction laser.

In one embodiment, it has been observed that the temperature of the growth process assists in achieving a columnar configuration of the layers which are grown. For example, the growth temperature of an MBE process, in certain embodiments, may be less than about 650° C., less than about 600° C., and less than about 500° C. in order to produce layers of the ZnO junction laser which exhibit an approximately columnar configuration. In additional embodiments, the temperature of the growth process may be greater than about 400° C. Thus, in selected embodiments, the growth temperature may range between about 400-650° C., 400-600° C., and 400-500° C. Temperatures within these ranges may relax the strain between selected substrates and the layer being grown, enabling the grown layer to form in columnar configuration.

The method 100 begins at block 102 with the selection of the substrate 202. It has also been observed that the selection of the substrate 202, in combination with the growth temperature, assists in achieving a columnar configuration of the layers which are grown. By choosing an appropriate substrate 202, the growth of columnar structures may be promoted.

In one embodiment, the substrate 202 may comprise one of silicon (Si), sapphire, and glass. In an embodiment, sapphire substrates may comprise c-plane sapphire. In certain embodiments, Si substrates may comprise n-type silicon. In one embodiment, the crystal orientation of Si substrates may be selected. For example, the face of Si substrates may be approximately aligned with the [100] orientation. In alternative embodiments, the face of Si substrates may be approximately aligned with the [111] orientation.

In block 104, a plurality of buffer layers 204 may be deposited upon the substrate 202. The buffer layers 204 may serve to reduce the lattice mismatch between the substrate 202 and ZnO which is deposited upon the substrate 202, as discussed below.

In one embodiment, the buffer layers 204 may comprise magnesium oxide (MgO), zinc oxide (ZnO), and combinations thereof. MgO buffer layers may be deposited at a temperature of between about 320 to 400° C., for example, about 350° C. ZnO buffer layers may be further deposited upon the MgO buffer layer at about the same temperature. In certain embodiments, ZnO buffer layers may comprise undoped portions of the n-type ZnO formed in block 106A, discussed below.

The thickness of the deposited MgO and ZnO buffer layers 204 may also be varied. In one embodiment, the thickness of the MgO and ZnO buffer layers 204 may each be independently selected to be between about 0.005 to 0.02 μm. In further embodiments, the thickness of the MgO buffer layer may be about 0.005 μm and the thickness of the ZnO buffer layer may be about 0.015 μm.

In block 106, ZnO p-n junction structures may be formed upon the substrate. An n-type ZnO layer 206, a ZnO quantum well structure 210, and a p-type ZnO layer 212 may be formed upon the buffer layers 204 in Blocks 106A, 106B, and 106C, respectively.

The n-type ZnO layer may be formed in block 106A. In one embodiment, the n-type ZnO layer 206 may comprise doped ZnO, undoped ZnO, and combinations thereof. In further embodiments, the n-type ZnO layer 206 may comprise gallium (Ga)-doped ZnO. The n-type Ga:ZnO layer may be formed by Ga doping at temperatures ranging between about 400 to 650° C., such as about 450° C.

The p-type ZnO layer may be formed in block 106C. In an embodiment, the p-type ZnO layer 212 may comprise Sb-doped ZnO. The p-type Sb:ZnO layer may be formed by Sb doping at a temperature between about 400 to 650° C., such as about 550° C. An effusion cell may be used to sublimate the Sb atoms on the substrate while growing the ZnO film. The effusion temperature can be adjusted by a power supply, depending on the desired doping concentration. For example, the effusion temperature may be about 350° C.

In further embodiments, the Sb-doped ZnO may be annealed at a temperature greater than about 750° C. for about 5-30 minutes, for example, about 0.3 h (18 minutes) in vacuum with or without plasma oxygen flow in order to activate the Sb dopants. The activation process provides sufficient thermal energy for the Sb dopant atoms, which are initially present within interstitial sites of the ZnO, to substitute for Zn, making the ZnO material p-type.

The thickness of the p- and n-type ZnO layers 206, 212 may also be varied. In one embodiment, the thickness of the p- and n-type ZnO layers 206, 212 may each be independently varied greater than about 0.2 µm. For example, the thickness of each of the p- and n-type ZnO layers 206, 212 may each be independently varied between about 0.3 to 0.4 µm. In further embodiments, the thickness of the p- and n-type ZnO layers 206, 212 may each be the same, for example, about 340-350 nm. In additional embodiments, the thickness of the n-type ZnO layer 206 may be greater than that of the p-type ZnO layer 212.

The ZnO quantum well structure 210 may be deposited between the p- and n-type ZnO layers 206, 212 in block 106B, prior to deposition of the p-type ZnO layer 212 in block 106C. The ZnO quantum well structure 210 may comprise a single ZnO quantum well or multiple quantum wells, as necessary, with wider band gap material layers as barrier layers 210A. The quantum well(s) structure 210 may be interposed between the n- and p-type ZnO layers 206, 212. In certain embodiments, a single quantum well may be sufficient to establish lasing. In other embodiments, multiple quantum wells may be employed to enhance the lasing output power.

The thicknesses of the layers of each of the ZnO quantum wells 210B and barrier layers 210A, as well as their number, may be varied, as necessary. In certain embodiments, single ZnO quantum well(s) 210B may be deposited with a selected thickness ranging between about 1 nm to 5 nm, for example, about 1 nm. The barrier layers 210A may range in thickness between about 1 nm to 3 nm, for example about 1.5 nm. The number of quantum wells 210B, and their associated barrier layers 210A, may range from 1 to tens to hundreds or more, as necessary to achieve the desired lasing output power.

In one embodiment, the barrier layers 210A may comprise magnesium zinc oxide, MgZnO. In another embodiment, the quantum well barrier layers 210A may comprise beryllium zinc oxide, BeZnO.

The mole fraction of Mg or Be within the quantum well barrier layers 210A may also be varied in order to provide a selected conduction band offset between the ZnO quantum well 210B and the barrier layers 210A. For example, the mole fraction of Mg may be varied between about 0.05 to 0.5 in order to yield a conduction band offset between about 0.1 to 0.6 eV. In one embodiment, a mole fraction of about 0.1 Mg may be employed to yield a conduction band offset of about 0.21 eV.

In block 110, the shape of the ZnO laser diode may be defined by using one or more shaping techniques. Shaping techniques may be employed to define the shape of the sides of the ZnO laser diode, establishing whether light is emitted from about the direction of the sides of the ZnO laser diode (edge emitting) or the direction of the surface of the ZnO laser diode (surface emitting). In one embodiment, shaping may be performed by employing a combination of optical lithography and wet etching. In other embodiments, the shape of the ZnO laser diode may be defined by polishing and/or cleaving.

Figure 4A:
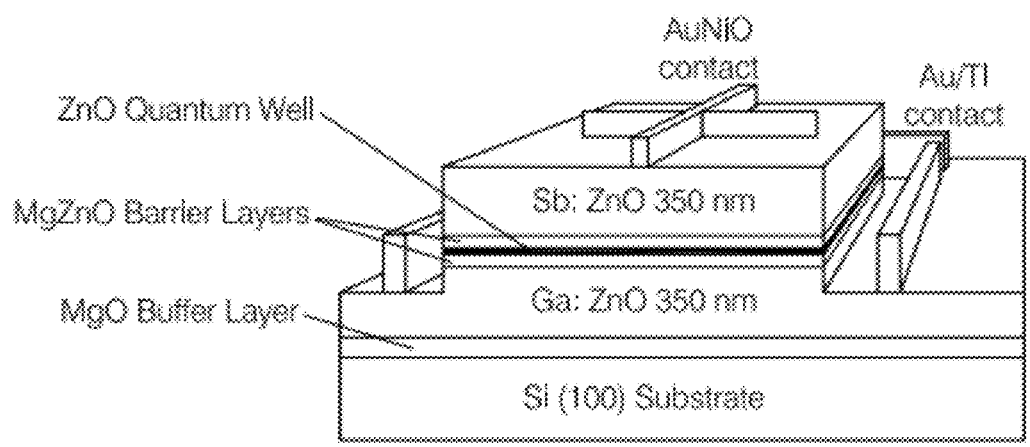
FIG. 4A is a schematic illustrating a perspective view of an embodiment of a columnar ZnO laser diode. One or more quantum wells may be interposed between the p-type and n-type layers and a device mesa with Ohmic contacts.

Device shapes may include, but are not limited to, simple geometric shapes such as squares and trapezoids. FIG. 4A illustrates one embodiment of a square-shaped mesa ZnO laser diode.

Ohmic contacts 214A, 214B may also be deposited upon the n- and p-type ZnO layers 206, 212 in Block 112. The deposition may be performed, in certain embodiments, using a lift-off process and annealing at a temperature between about 700 to 800° C. for between about 0.3 to 0.5 h. The material deposited for the Ohmic contacts 214A, 214B may be different for each of the n- and p-type ZnO layers 206, 212. In one embodiment, the Ohmic contact 214A in electrical communication with the n-type ZnO layer 206 may comprise gold and titanium (Au/Ti), with thicknesses of about 200 and 30 nm, respectively. In another embodiment, the Ohmic contact 214B in electrical communication with the p-type ZnO layer 212 may comprise gold and nickel oxide (Au/NiO), with thicknesses of about 200 and 30 nm, respectively. The thickness of NiO may be less than about 30 nm. As an alternative, Au/Ni may be used as the Ohmic contact to p-type ZnO.

In this manner, the area of the ZnO laser diode 200 employed for lasing may be formed of a selected size, for example, approximately 500 µm×500 µm. It may be understood, however, the processes and techniques discussed above may be adapted to provide a ZnO laser diode 100 having a lasing area larger or smaller than 500 µm×500 µm.

An embodiment of a ZnO laser diode formed according to the method 100 was examined using a variety of techniques in order to determine the orientation in which the layers of the diode grow (FIG. 3A). The laser diode comprised a ZnO laser diode, on a Si substrate, having a total thickness of about 700 nm (about 350 nm n-type ZnO and about 350 nm p-type ZnO). An MgO buffer layer having a thickness of about 2-5 nm was positioned between the substrate and the n-type ZnO layer and a ZnO quantum well structure with MgZnO barrier layers interposed between the n-type ZnO layer and the p-type ZnO layer. AuTi ohmic contacts were formed in electrical communication with the n-type ZnO and Au/NiO ohmic contacts were formed in electrical communication with the p-type ZnO. The lateral extent of this mesa diode was about 500 µm×500 µm.

Figure 4B:
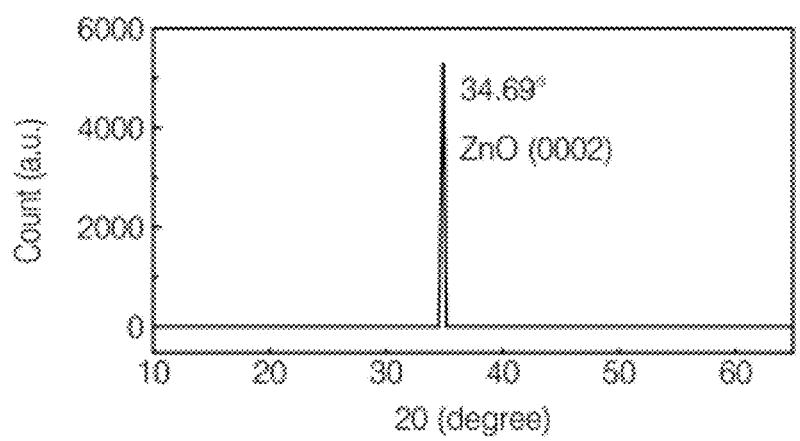
FIG. 4B is a θ-2θ X-Ray Diffraction (XRD) scan of one embodiment of the ZnO laser diode.

FIG. 4B illustrates a θ-2θ X-Ray Diffraction (XRD) scan of the laser diode. This scan suggests that the diode film grows preferentially along the <0001>, or c-direction, of the ZnO Wurtzite lattice.

FIGS. 4C and 4D are top down and cross-sectional SEM images, respectively, of the ZnO laser diode of FIG. 4B. These SEM images reveal that substantially vertical ZnO nano-column structures are formed, a result of oriented nucleation process arising from the large lattice mismatch between the ZnO and Si substrate. For example, the in-plane size (e.g. grain size) of the columnar grains may range between about 50 to 500 nm. However, as can be seen from the cross-sectional view of FIG. 4D, the grains comprise a plurality of substantially closely packed columns that form a substantially continuous thin film, which makes it feasible for the formation of Ohmic contacts on top of the n- and p-type ZnO layers 206, 212. FIG. 4E schematically illustrates the nano-columnar structure of embodiments of the ZnO diode laser.

Figure 5:
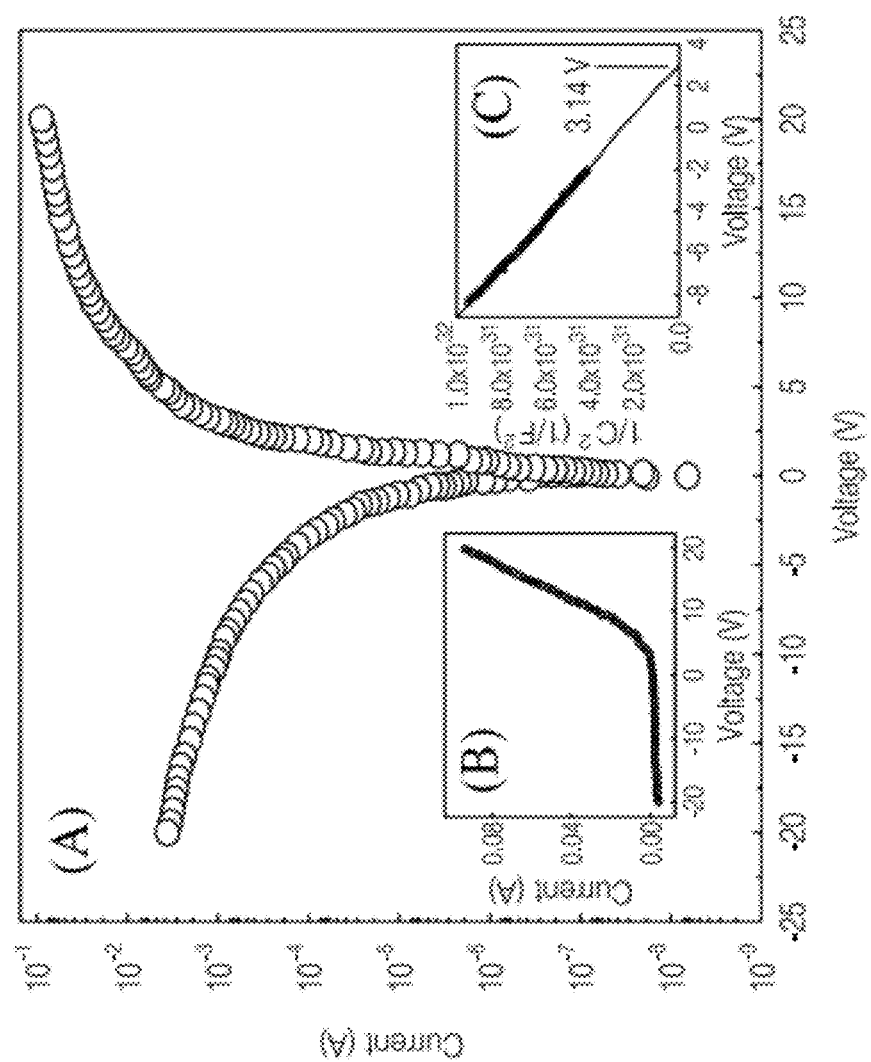
FIG. 5A is a plot of the current-voltage (I-V) characteristics of an embodiment of the ZnO laser diode, in semi-logarithmic scale.
FIG. 5B is an inset plot of the I-V characteristics of FIG. 4A, in linear scale.
FIG. 5C is an inset plot illustrating capacitance-voltage (C-V) characteristics of an embodiment of the ZnO laser diode, further confirming the p-n junction with a built-in potential of about 3.14 V.

With the formation of the Ohmic contacts (e.g. Au/NiO top-type ZnO and Au/Ti to n-type ZnO) on the structure of FIG. 4A, the electrical properties of the ZnO laser diode 100 were characterized using an Agilent B 1500 A semiconductor parameter analyzer and 4284A LCR meter. FIG. 5A shows the current-voltage (I-V) characteristics of an embodiment of the ZnO laser diode of FIG. 4A. The left inset of FIG. 5B presents the I-V characteristics of FIG. 5A plotted in linear scale. The I-V characteristics of the ZnO laser diode suggest that the ZnO laser diode 100 exhibits rectifying characteristics of a diode. The right inset of FIG. 5C illustrates the capacitance-voltage (C-V) characteristics of an embodiment of the ZnO laser diode, illustrating a built-in potential of about 3.14 V.

The laser diode was biased under DC forward voltages, also referred to as continuous current injection mode, in order to obtain lasing. The lasing was collected from the sample surface, instead of the edge. The surface emission from the laser arises from the existence of the tilted side walls of the etched diode mesa, i.e., the side planes of the mesa are not normal to the substrate as a result of wet etching. The lasing is generated in the film plane and then reflected/refracted from the side walls of the mesa to form the surface emission. If the side walls of the diode mesa are made normal to the substrate by either polishing or etching, the lasing becomes edging emitting, as claimed later.

Figure 6A:
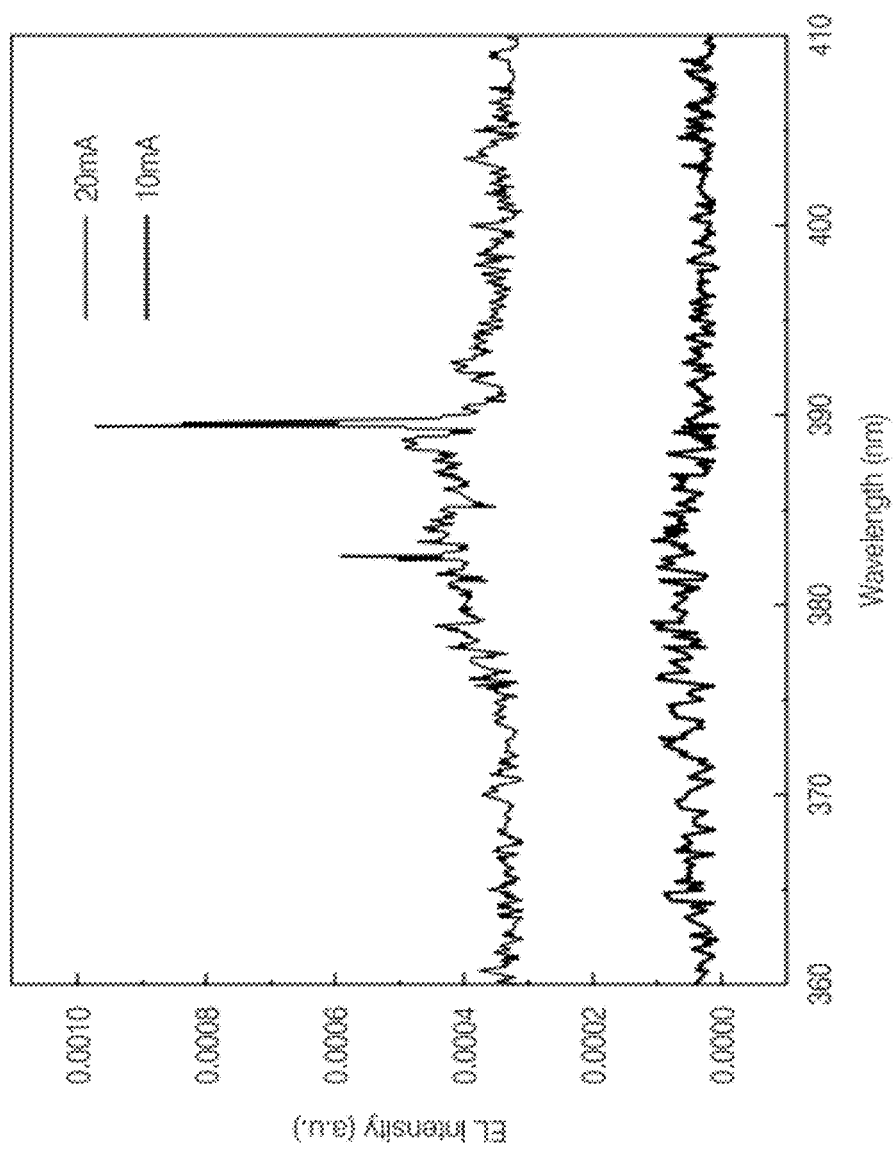
FIG. 6A shows electroluminescence (EL) spectra of an embodiment of the ZnO laser diode with injection currents ranging between about 10 mA and 20 mA. It may be observed that the lasing effect is evident when the injection current reaches about 20 mA.
Figure 6B:
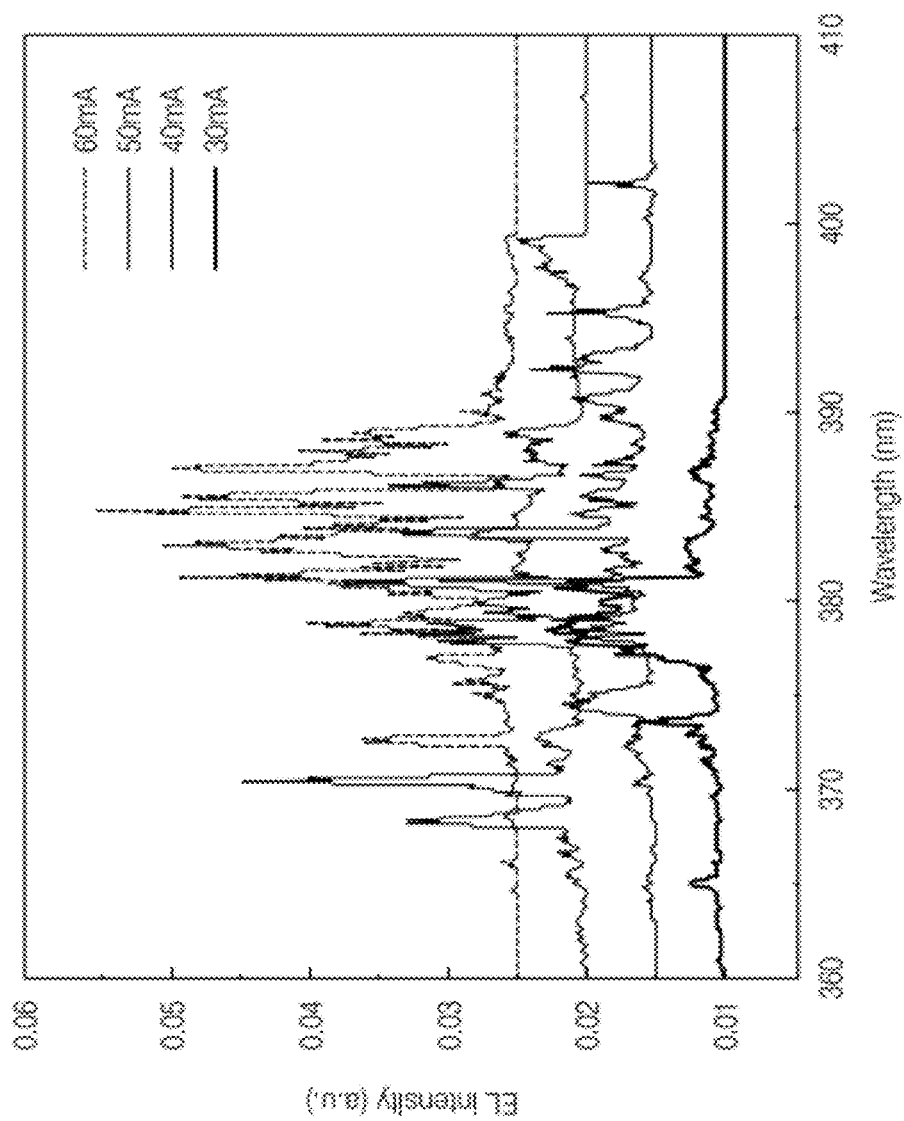
FIG. 6B shows EL spectra of an embodiment of the ZnO laser diode with injection currents ranging from about 30 mA to 60 mA.

EL spectra for injection currents of between about 10 to 60 mA are illustrated in FIGS. 6A and 6B. The spectra are shifted in y scale for clarity. It may be observed that all spectra are within the UV range, around 380 nm. Furthermore, as the injection current increases, the center of the emissions red-shifts slightly.

Under a relatively low injection current, approximately 10 mA, a weak spontaneous emission band from about 370 nm to 390 nm, centered at about 378 nm, was observed, as illustrated in FIG. 5A. This peak is attributed to near-band-edge emission. It should also be noted that the deep level emissions in the visible region, beyond about 400 nm, is absent in the electroluminescence (EL) spectrum, indicating very good device quality. As the injection current is increased to about 20 mA, dramatic, sharp emissions with oscillation in a line width as narrow as about 0.4 nm emerge from the single-broad emission spectra around 378 nm. These observations indicate that, at about 20 mA, the gain is large enough to enable cavity mode to start lasing.

Further increasing the injection current from about 20 mA to 60 mA results in an increase in both the number and intensity of sharp lasing mode peaks in the spectra region between about 360 nm to 400 nm, as shown in FIG. 6B. The center of the lasing spectrum red-shifts about 4-5 nm as the drive current increases from about 10 mA to 60 mA, a phenomenon that is related to the band gap variation by heating effect.

Figure 7:
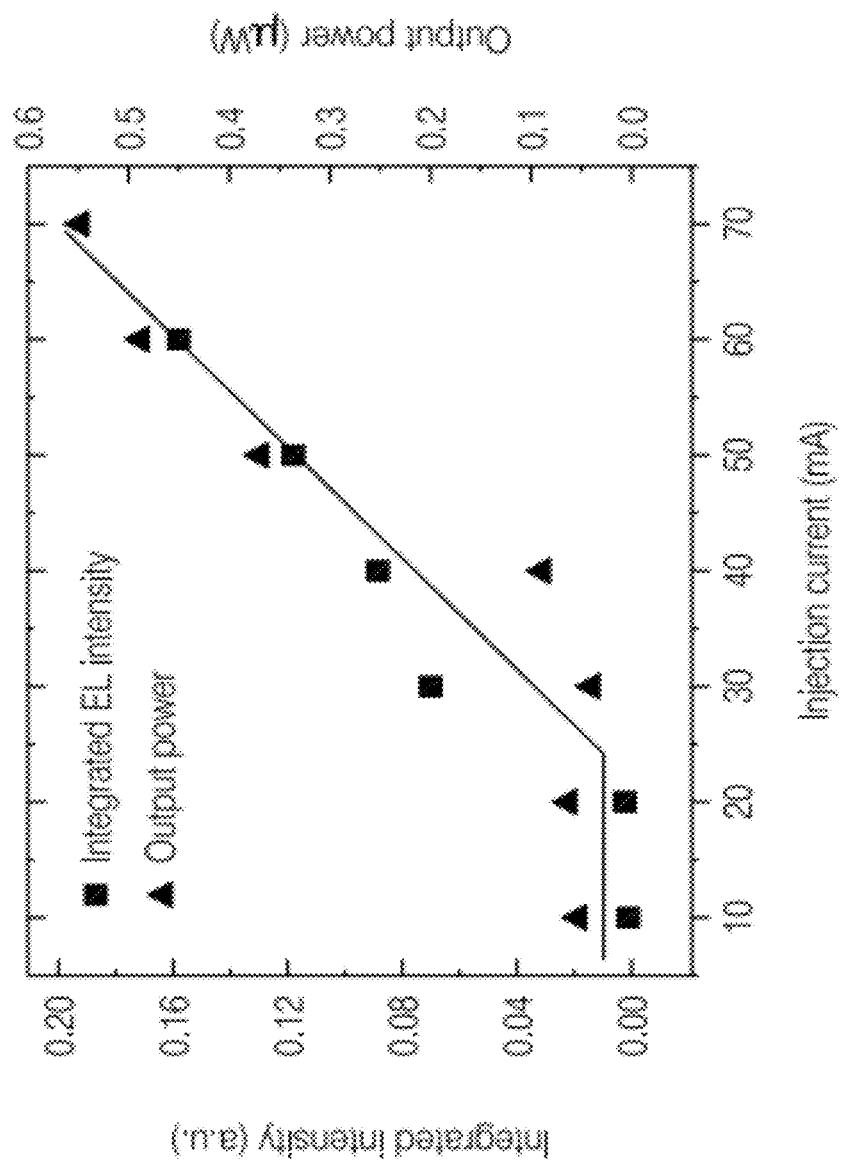
FIG. 7 is a plot of integrated EL intensity and output power as a function of the injection current for an embodiment of the ZnO laser diode. The threshold current can be determined to be about 25 mA from these data. Further, the output power is about 0.5 µW at about 60 mA.

FIG. 7 is a plot of integrated EL intensity and output power as a function of the injection current for an embodiment of the ZnO laser diode. The output power was measured using a Thorlab PM 120V power meter, and it is observed that the integrated lasing spectrum intensity matches reasonably well with the output power data trend. A solid line is plotted to guide the eyes, showing the threshold current of about 25 mA, corresponding to current density of about 10 A/cm$^2$. The output power is about 0.5 µW at about 60 mA drive current. Further increasing the driving current beyond about 60 mA leads to sharper increase of output power, a slight deviation of the trend suggested by the solid line, for example, about 1.4 µW at about 80 mA, about 9 µW at about 120 mA, and about 11.3 µW at 130 mA. These measurements are another indication of exciton lasing.

It may be noted that these numbers were obtained for the first time for ZnO lasers and should be very reasonable, considering the system examined possessed a surface-emitting geometry with only a single quantum well. The very low turn-on current mainly results from strong exciton recombination efficiency in the ZnO quantum wells.

Without being bound by theory, the following discussion speculates on a possible reason behind the strong lasing from the surface of the ZnO diodes. The ZnO film comprises vertical nanoscale columnar structures that act as random scattering media. Light scatters from the grain boundaries, and, when the scattering is strong enough and the mean free path of the light is comparable to its wavelength, some of the light can be scattered to its original places. As a result, close loops resonant cavities for coherent lasing are formed. These close loops are in the film plane due to the vertical side planes of the columnar structures, leading to the generation of lasing in the mesa edge direction. The outcome of the surface emission detection arises from the tilted side walls of the diode mesa.

A signature of random lasing is that the light is emitted in all directions. Embodiments of the disclosed devices show similar lasing spectra at about 0-60° with respect to the normal direction. This is reasonable, since the side walls of the mesa are not strictly perpendicular to the substrate, thus light can be scattered to all directions.

In order to further establish the result that the similar layers of ZnO laser diodes formed according to embodiments of the method 100 lead to lasing, a second embodiment of the ZnO laser diode was formed and examined. This second laser diode was approximately the same as the first laser diode discussed above with respect to FIGS. 3A-3D, except that total thickness was less than that of the first ZnO laser diode, approximately 460 nm (about 230 n-ZnO and about 230 p-ZnO).

Figure 4G:
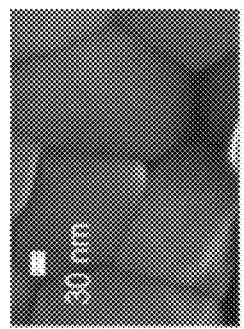
FIG. 4G is an SEM image of a top surface of an embodiment of a ZnO film on a Si substrate.
Figure 4H:
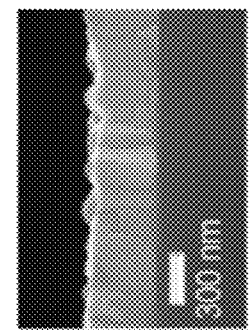
FIG. 4H is an SEM image of a cross-section of an embodiment of a ZnO film on a Si substrate.
Figure 4F:
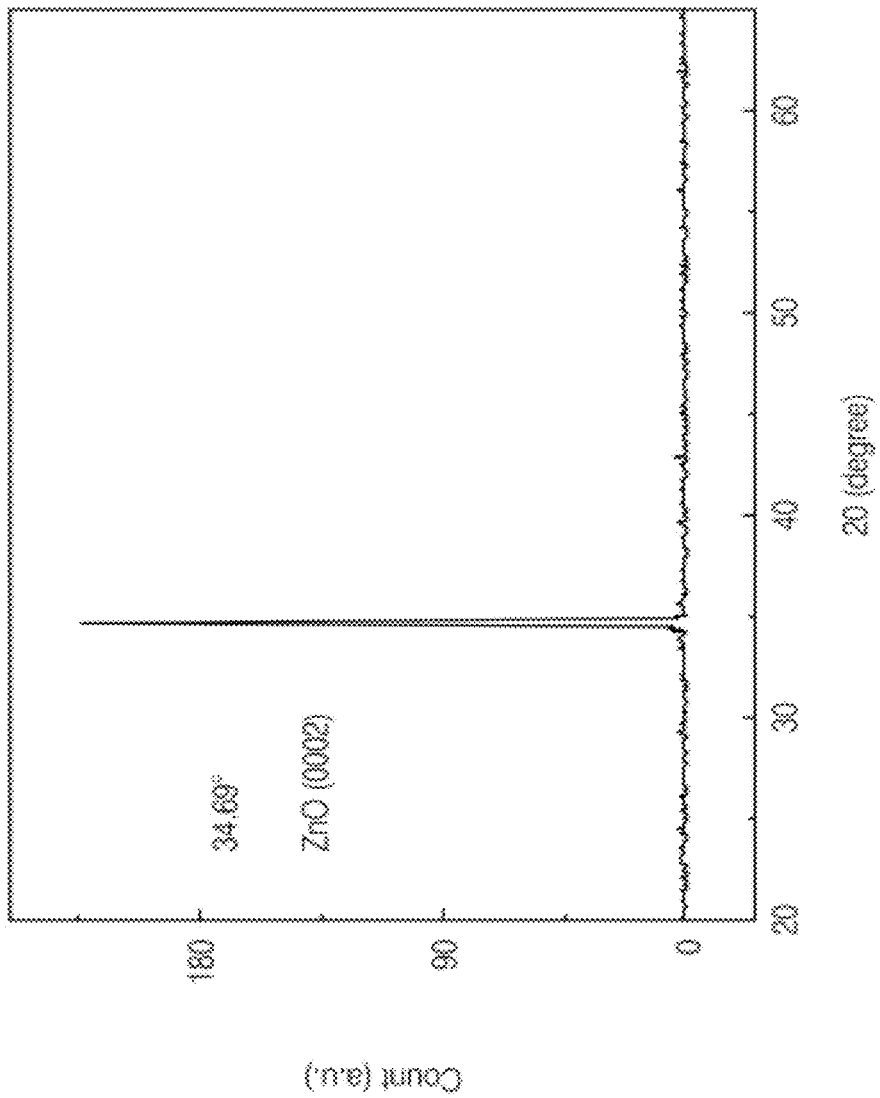
FIG. 4F is a θ-2θ X-Ray Diffraction (XRD) scan of another embodiment of the ZnO laser diode.

FIG. 4F shows a θ-2θ X-Ray Diffraction (XRD) scan of the second ZnO laser diode. The peak in the XRD scan, located at about 34.69°, was observed from the ZnO (0002) plane. The inset plots of FIGS. 4G and 4H give top and cross-section SEM images, respectively, of the second, thinner ZnO laser diode, indicating the presence of nano-columnar structures, consistent with the findings of the thicker ZnO laser diode. This suggest that the existence of quantum well(s) and the formation of columnar structures are important to form lasing while the thicknesses of n- and p-ZnO layers can be adjusted.

Figure 8:
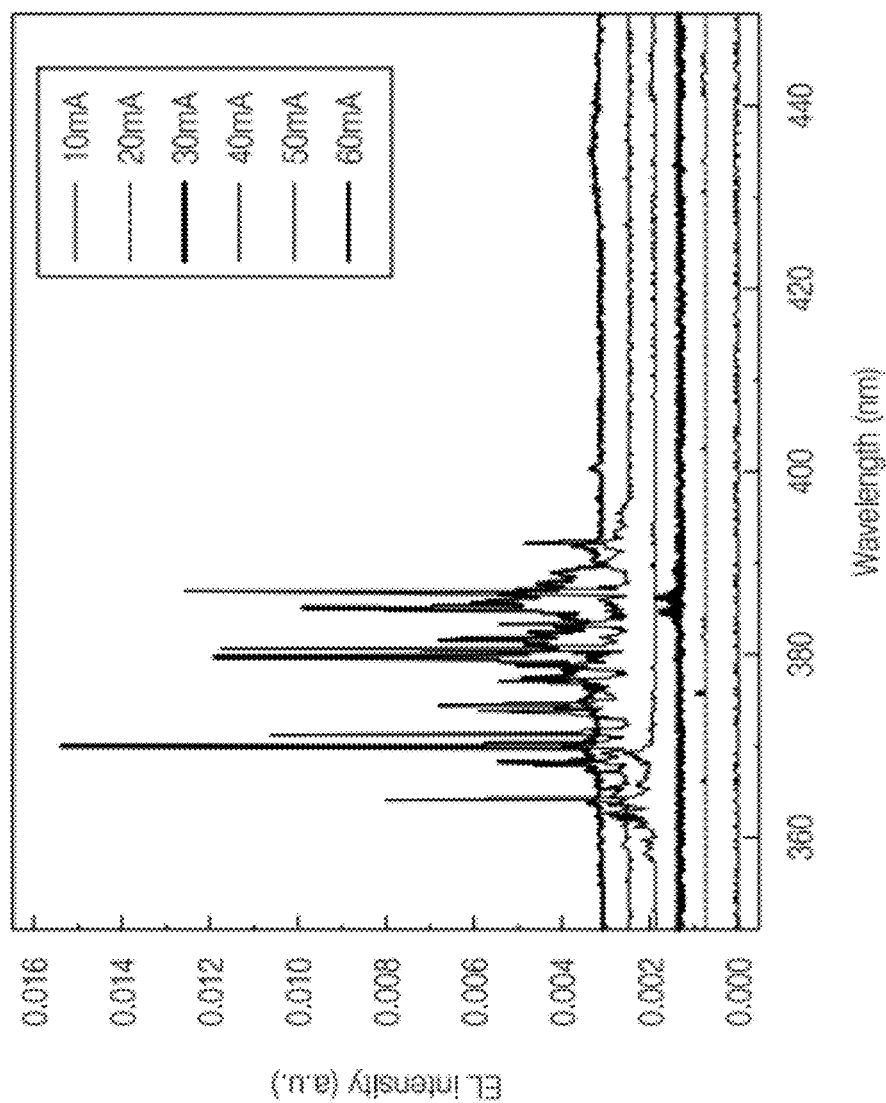
FIG. 8 is a plot of surface-emission spectra of an embodiment of the ZnO laser diode under different injection currents, illustrating that lasing starts at about 20 mA. For clarity, the spectra are shifted in y-axis.

Strong surface emission was also observed in this second ZnO laser diode as well, as illustrated by the EL intensity versus wavelength plot illustrated in FIG. 8. For example, this second ZnO laser diode also showed room-temperature lasing, with a slightly smaller threshold pump current of about 20 mA or about 8 A/cm$^2$.

The lasing is related to exciton emissions closely associated with the embedded MgZnO/ZnO/MgZnO quantum well structure. As the ZnO laser diode is forward biased, the injected electrons and holes quickly form excitons and become localized around the ZnO quantum well 210B. More carriers injected into the junction at the higher drive currents result in carrier-exciton and exciton-exciton inelastic collisions, which dissociate the localized excitons to form carrier population inversion conditions for stimulated emissions.

Figure 1B:
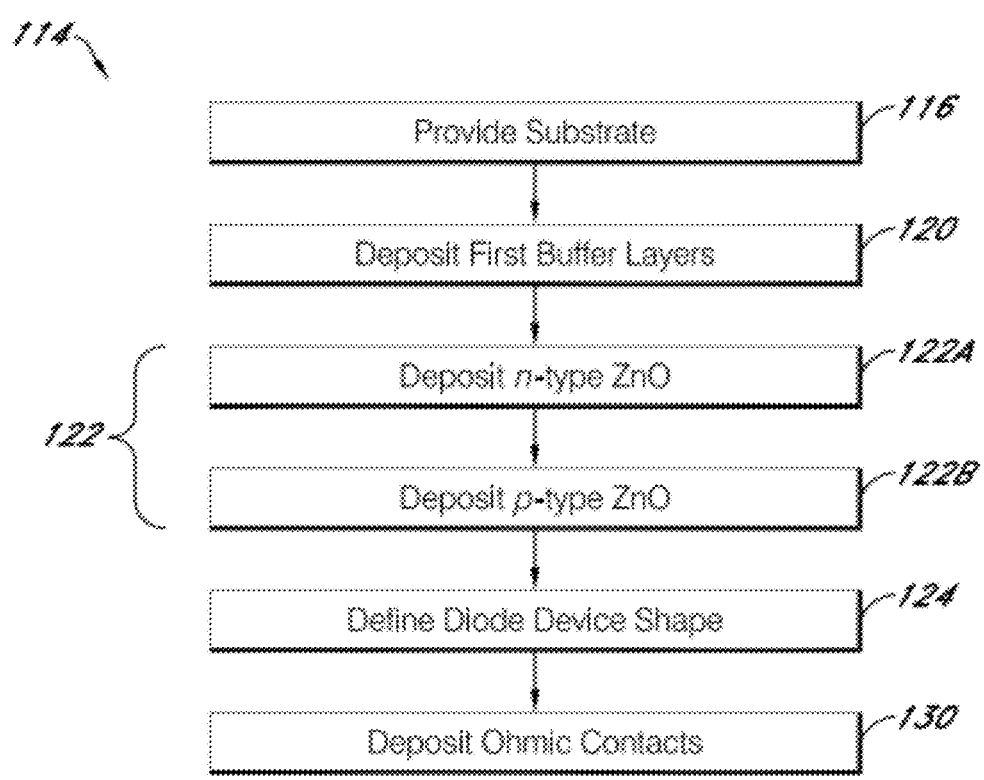
FIG. 1B is a diagram illustrating one embodiment of a process for the fabrication of a columnar ZnO light emitting diode (LED)

In order to form high-performance ZnO light emitting diodes (LEDs), a method similar to that of FIG. 1A for laser diodes may be followed. One embodiment of such a method 114 is illustrated in FIG. 1B. The notable difference between methods 100 and 114 is that the formation of the ZnO quantum well described with respect to method 100 is omitted in method 114. Otherwise, the operations of the method 100 (e.g., 102, 104, 106A, 106C, 110, 112) correspond, respectively, to the operations of the method 114 (e.g., 116, 120, 122, 124, 126, 130).

Figure 9:
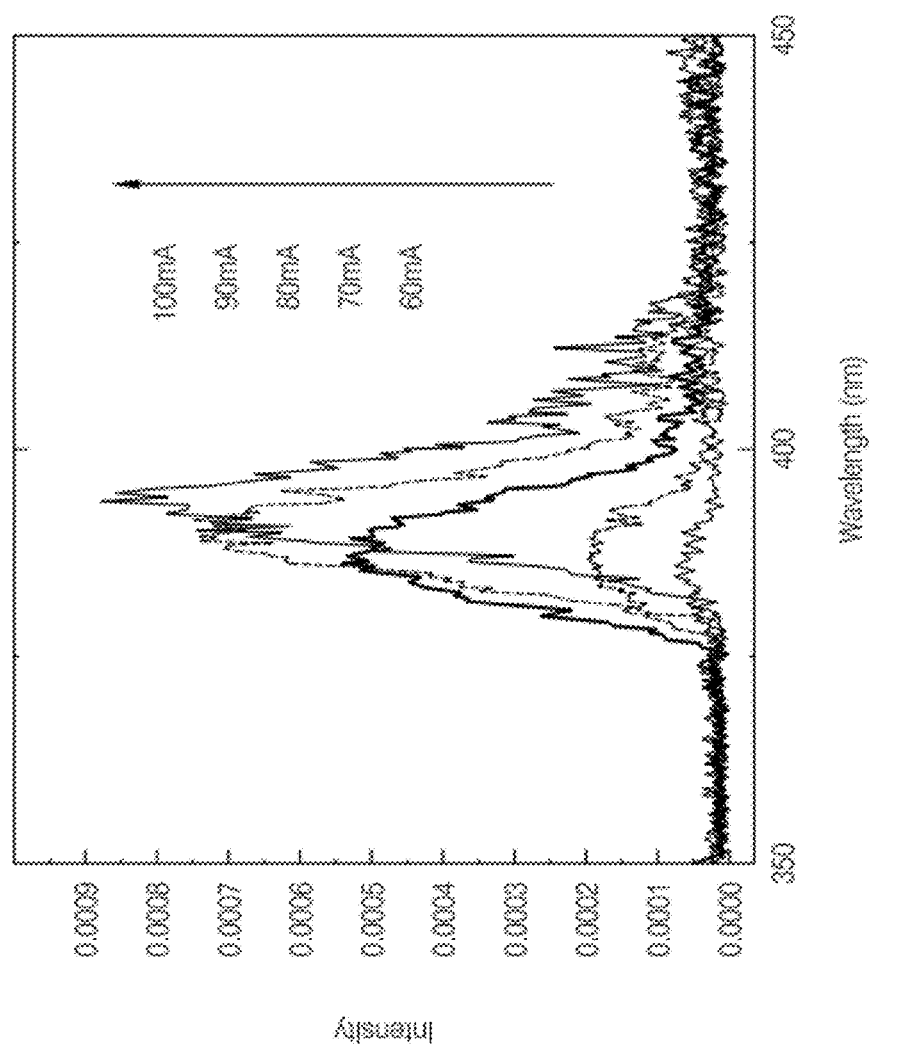
FIG. 9 shows EL spectra of an embodiment of an LED device with ZnO columnar configuration, but without embedded quantum wells. Excellent near-band-edge emission is observed, while substantially no lasing action is observed.

FIG. 9 shows EL spectra measured for an embodiment of a ZnO LED that is without a ZnO quantum well structure 210. As shown in FIG. 9, approximately pure ultraviolet emissions are observed.

In summary, embodiments of electrically pumped ZnO diode lasers and LEDs having columnar structures are disclosed. Methods for fabricating the same are also discussed. The ZnO diode laser, in certain embodiments, may be formed on a substrate using Sb-doped ZnO as a p-type layer and an n-type ZnO layer, such as Ga-doped ZnO. A ZnO quantum well structure (e.g., MgZnO/ZnO/MgZnO) may be further formed in between the n- and p-type ZnO layers.

Ultraviolet lasing at around 380 nm was demonstrated at about room temperature with very low lasing threshold current density, about 10 A/cm$^2$. The output power of this laser diode was further measured to be about 11.3 µW at about 130 mA driving current. Furthermore, by omitting the quantum well structure, ZnO LEDs may be formed. Beneficially, the disclosed embodiments illustrate systems and methods by which electrically pumped ZnO exciton ultraviolet lasing may be achieved, which may find many potential applications.

Although the foregoing description has shown, described, and pointed out the fundamental novel features of the present teachings, it will be understood that various omissions, substitutions, and changes in the form of the detail of the apparatus as illustrated, as well as the uses thereof, may be made by those skilled in the art, without departing from the scope of the present teachings. Consequently, the scope of the present teachings should not be limited to the foregoing discussion, but should be defined by the appended claims.

What is claimed is:

1. A ZnO diode laser, comprising:
   a substrate comprising at least one of glass, sapphire, and silicon; and
   a substantially continuous layer positioned upon the substrate, comprising:
     an n-type ZnO layer;
     a Sb-doped p-type ZnO layer; and
     a ZnO-based quantum well structure interposed between the n-type ZnO layer and the Sb-doped p-type ZnO layer;
   wherein grains of each of the n-type ZnO layer, the Sb-doped p-type ZnO layer, and the ZnO-based quantum well structure are vertically aligned through the thickness of the substantially continuous layer; and
   wherein the substantially continuous layer further comprises a plurality of columns in divided by respective vertically aligned grains.

2. The diode laser of claim 1, wherein the n-type ZnO layer comprises Ga-doped ZnO, undoped ZnO, and combinations thereof.

3. The diode laser of claim 1, further comprising at least one buffer layer interposed between the substrate and the n-type ZnO layer, the at least one buffer layer comprising MgO, ZnO, and combinations thereof and possessing a columnar configuration.

4. The diode laser of claim 3, wherein the n-type ZnO layer is positioned upon the one or more buffer layers and the Sb-doped p-type ZnO layer is positioned upon the ZnO-based quantum well structure.

5. The diode laser of claim 1, wherein the n-type ZnO layer, the Sb-doped p-type ZnO layer, and the ZnO-based quantum well structure each comprise a plurality of substantially closely packed columns.

6. The diode laser of claim 5, wherein each column has a grain size ranging between about 50 to 500 nm.

7. The diode laser of claim 5, wherein the ZnO quantum well structure comprises a plurality of ZnO quantum wells and a plurality of barrier layers that are interposed between the n-type ZnO and the Sb-doped p-type ZnO layers.

8. The diode laser of Claim 7, wherein the barrier layers comprise MgZnO, BeZnO, and combinations thereof.

9. The diode laser of claim 8, wherein the mole fraction of Mg within the MgZnO barrier layers ranges between about 0.05 to 0.5.

10. The diode laser of claim 8, wherein the mole fraction of Mg within the MgZnO barrier layers is selected to provide a conduction band offset between the ZnO quantum well and the MgZnO barrier layer ranging from about 0.1 to 0.6 eV.

11. The diode laser of claim 1, further comprising a first Ohmic contact electrically interconnected to the n-type ZnO comprising gold/titanium (Au/Ti).

12. The diode laser of claim 1, further comprising a second Ohmic contact electrically interconnected to the Sb-doped p-type ZnO comprising gold/nickel oxide (Au/NiO) or gold/nickel (Au/Ni).

13. The diode laser of claim 3, wherein the columnar n-type ZnO layer, at least one buffer layer, Sb-doped p-type ZnO layer, and ZnO-based quantum well structure comprise a mesa possessing side walls and wherein the mesa side walls are positioned at an angle of about 0° with respect to the normal to the substrate surface so as to induce the laser diode to emit from about its edge.

14. The diode laser of claim 3, wherein the columnar n-type ZnO layer, at least one buffer layer, Sb-doped p-type ZnO layer, and ZnO-based quantum well structure comprise a mesa possessing side walls and wherein the mesa side walls are positioned at an angle ranging between about 1 to 89° with respect to the normal to the substrate surface so as to induce the laser diode to emit from about its surface.

* * * * *